United States Patent
Sato et al.

(10) Patent No.: US 9,784,573 B2
(45) Date of Patent: Oct. 10, 2017

(54) POSITIONAL DEVIATION MEASURING DEVICE, NON-TRANSITORY COMPUTER-READABLE RECORDING MEDIUM CONTAINING A POSITIONAL DEVIATION MEASURING PROGRAM, AND METHOD OF MANUFACTURING SEMICONDUCTOR DEVICE

(71) Applicant: Toshiba Memory Corporation, Minato-ku (JP)

(72) Inventors: Hidenori Sato, Yokohama (JP); Yosuke Okamoto, Sagamihara (JP); Nobuhiro Komine, Nagoya (JP); Manabu Takakuwa, Tsu (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 131 days.

(21) Appl. No.: 14/736,727

(22) Filed: Jun. 11, 2015

(65) Prior Publication Data
US 2016/0245645 A1   Aug. 25, 2016

(30) Foreign Application Priority Data
Feb. 24, 2015   (JP) ................. 2015-034072

(51) Int. Cl.
| G01B 11/27 | (2006.01) |
|---|---|
| H01L 21/67 | (2006.01) |
| H01L 21/027 | (2006.01) |
| H01L 21/66 | (2006.01) |
| G03F 7/20 | (2006.01) |

(52) U.S. Cl.
CPC ........ *G01B 11/272* (2013.01); *G03F 7/70633* (2013.01); *G03F 7/70783* (2013.01); *H01L 21/0273* (2013.01); *H01L 22/12* (2013.01); *H01L 21/67288* (2013.01); *H01L 22/20* (2013.01)

(58) Field of Classification Search
None
See application file for complete search history.

(56) References Cited

U.S. PATENT DOCUMENTS

| 5,440,394 A | 8/1995 | Nose et al. |
| 7,375,810 B2 | 5/2008 | Nikoonahad et al. |
| 2013/0242304 A1* | 9/2013 | Hidaka ................ G03F 9/7026 |
| | | 356/369 |

FOREIGN PATENT DOCUMENTS

| JP | 05-152186 | 6/1993 |
| JP | 2000-349014 | 12/2000 |
| JP | 2005-156487 | 6/2005 |
| JP | 2005-520353 | 7/2005 |
| JP | 2007-005649 | 1/2007 |
| WO | WO 2004/008068 A1 | 1/2004 |

* cited by examiner

*Primary Examiner* — Angel Roman
(74) *Attorney, Agent, or Firm* — Oblon, McClelland, Maier & Neustadt, L.L.P.

(57) ABSTRACT

According to one embodiment, an adjusting unit adjusts a refracting angle of incident light with respect to a substrate, a detector detects reflected light from the substrate, and a calculating unit calculates positional deviation of the pattern based on patterns respectively reflected in reflected lights obtained from the incident light generating N number of refracting angles with respect to the substrate, where N is an integer of two or greater.

6 Claims, 15 Drawing Sheets

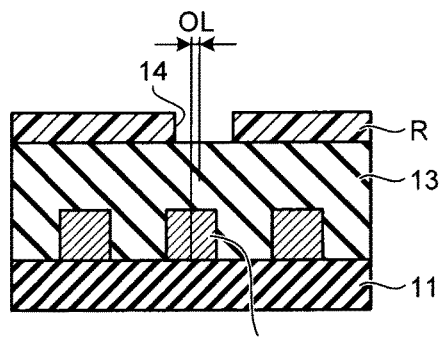
FIG.13A
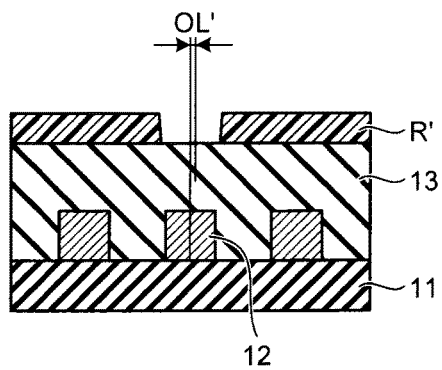
FIG.13B
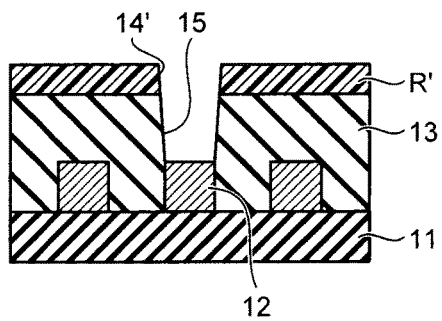
FIG.13C
FIG.13D
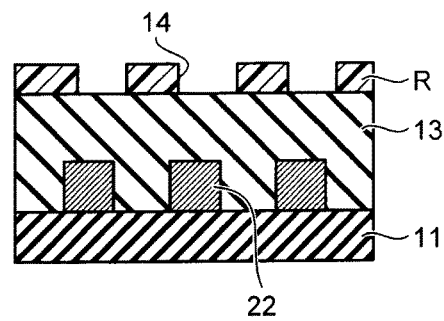
FIG.13E
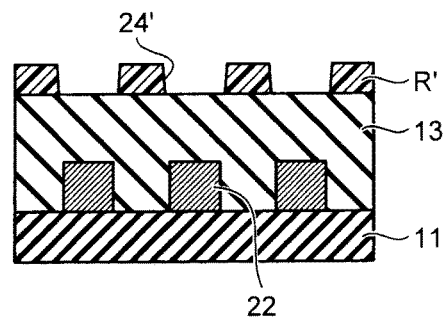
FIG.13F
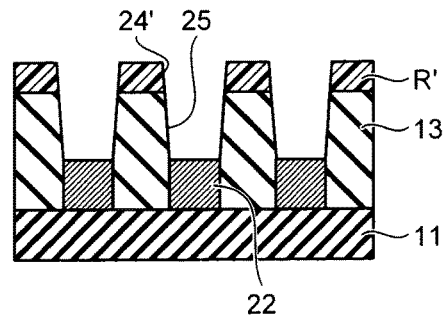
FIG.13G
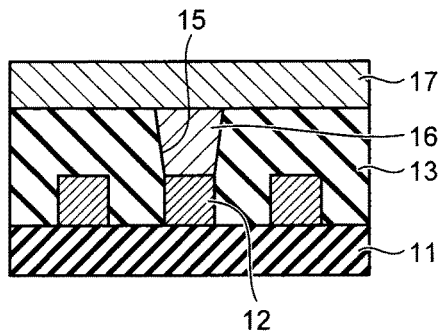
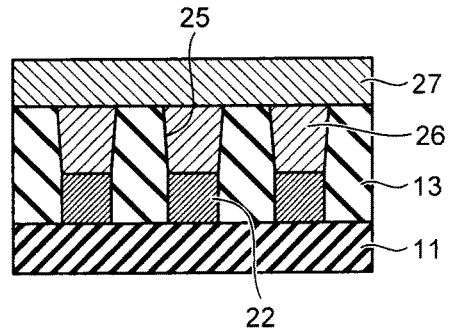
FIG.13H

POSITIONAL DEVIATION MEASURING DEVICE, NON-TRANSITORY COMPUTER-READABLE RECORDING MEDIUM CONTAINING A POSITIONAL DEVIATION MEASURING PROGRAM, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2015-34072, filed on Feb. 24, 2015; the entire contents of which are incorporated herein by reference.

FIELD

Embodiments described herein relate generally to a positional deviation measuring device, non-transitory computer-readable recording medium containing a positional deviation measuring program, and method of manufacturing a semiconductor device.

BACKGROUND

In the lithography process for semiconductor devices, there is used a method which provides positional-deviation detecting marks on wafers to measure deviation in the alignment of an upper-layer pattern and a lower-layer pattern. In this situation, because of a warp of the wafer or so on, an error may occur in a measurement of deviation in the alignment.

BRIEF DESCRIPTION OF THE DRAWINGS

FIGS. 13A to 13H are cross-sectional views showing the method of manufacturing the semiconductor device according to the fifth embodiment;

DETAILED DESCRIPTION

According to one embodiment, a positional deviation measuring device comprises an adjusting unit, a detector, and a calculating unit. The adjusting unit adjusts a refracting angle of incident light with respect to a substrate. The detector detects reflected lights from the substrate. The calculating unit calculates positional deviation of the pattern based on patterns respectively reflected in the reflected lights obtained from the incident light generating N number of refracting angles with respect to the substrate, where N is an integer of two or greater.

The positional deviation measuring device, positional deviation measuring program, and method of manufacturing a semiconductor device according to embodiments will be described in detail below with reference to the accompanying drawings. The present invention is not limited to these embodiments.

First Embodiment

Figure 1:
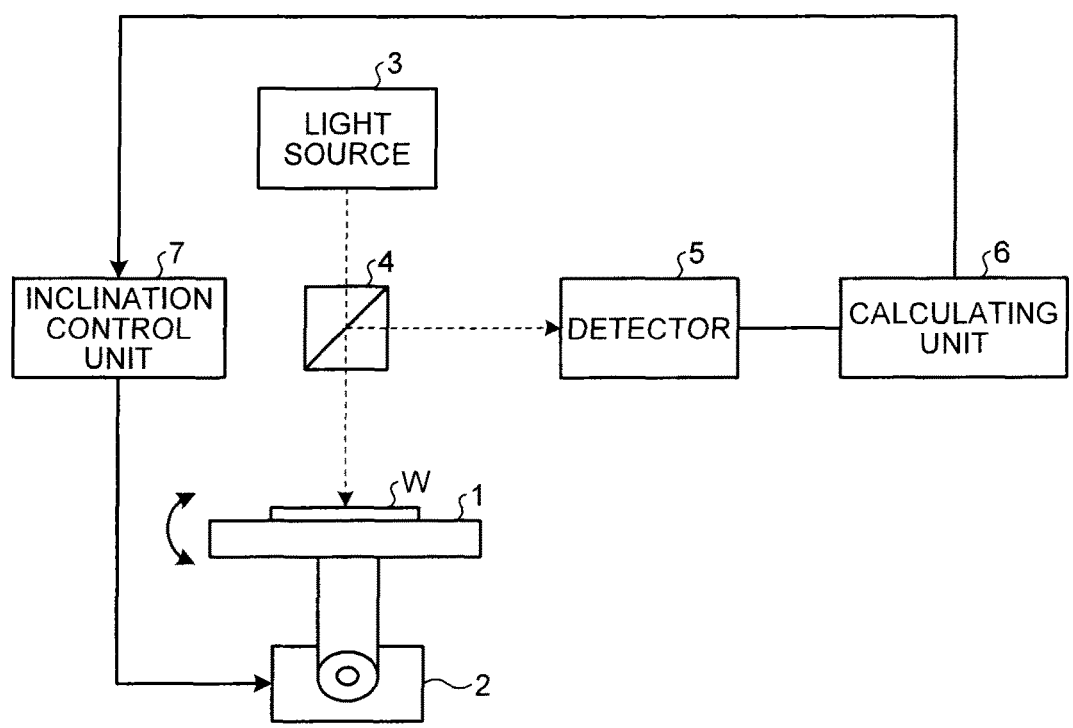
FIG. 1 is a block diagram showing schematically the configuration of a positional deviation measuring device according to a first embodiment.

FIG. 1 is a block diagram showing schematically the configuration of a positional deviation measuring device according to the first embodiment. In FIG. 1, a wafer stage 1, an angle adjusting unit 2, a light source 3, a half mirror 4, a detector 5, a calculating unit 6, and an inclination control unit 7 are provided in the positional deviation measuring device. The wafer stage 1 holds a wafer W. The angle adjusting unit 2 adjusts the angle of inclination of the wafer stage 1. The light source 3 generates light to be incident on the wafer W. The half mirror 4 separates light to be incident on the wafer W and reflected light from the wafer W. The detector 5 detects reflected light from the wafer W. Note that an image pickup device that picks up an image reflected in the reflected light can be used as the detector 5. The calculating unit 6 calculates deviation in pattern alignment based on patterns respectively reflected in reflected lights corresponding to N number of angles of light incidence onto the wafer W (N is an integer of two or greater). As this deviation in pattern alignment, there can be cited deviation in the alignment of an upper-layer pattern and lower-layer pattern formed over the wafer W. The lower-layer pattern may be lines, contact electrodes, or gate electrodes. The upper-layer pattern may be a resist pattern or a hard-mask pattern. The inclination control unit 7 controls the angle of inclination of the wafer stage 1.

Light to be incident generated by the light source 3 is incident on the wafer W via the half mirror 4. Then light reflected from the wafer W is incident on the detector 5 via the half mirror 4 and is detected by the detector 5. Then the calculating unit 6 extracts a pattern from an image reflected in the reflected light. Here, each time the calculating unit 6 extracts a pattern, the inclination control unit 7 controls the angle of inclination of the wafer stage 1 to change the angle of inclination of the wafer stage 1. Then each time the angle of inclination of the wafer stage 1 is changed, the calculating unit 6 extracts a pattern from an image reflected in the reflected light at this time. Then deviation in the pattern alignment is calculated based on patterns respectively reflected in reflected lights corresponding to N number of angles of light incidence.

Figure 2:
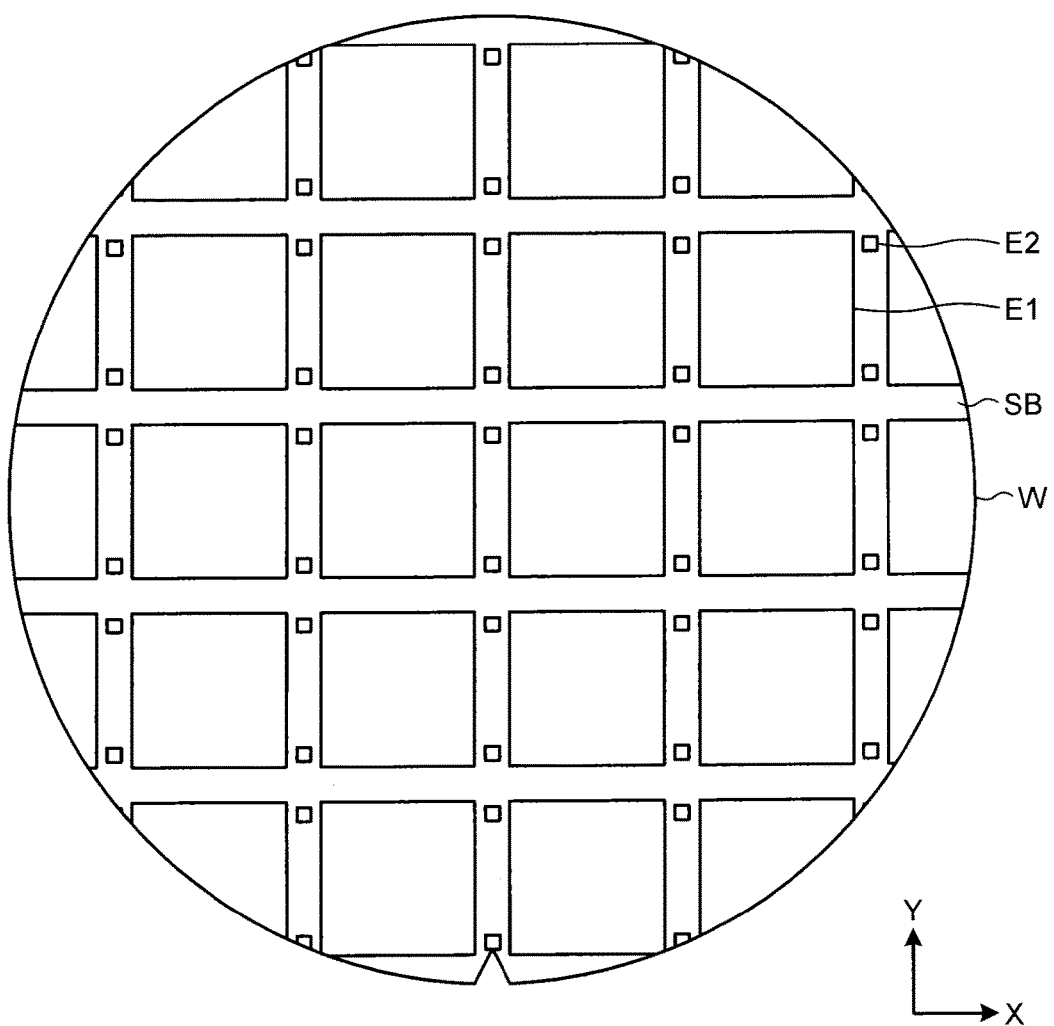
FIG. 2 is a plan view showing schematically an example configuration of a wafer to which the positional deviation measuring device of FIG. 1 is applied.

FIG. 2 is a plan view showing schematically an example configuration of a wafer to which the positional deviation measuring device of FIG. 1 is applied.

In FIG. 2, the wafer W is partitioned into chip areas E1 by scribe lines SB. On the scribe lines SB, mark areas E2 are provided. In the mark areas E2, positional-deviation detecting marks can be formed to detect deviation in the alignment of an upper-layer pattern and lower-layer pattern.

Figure 3:
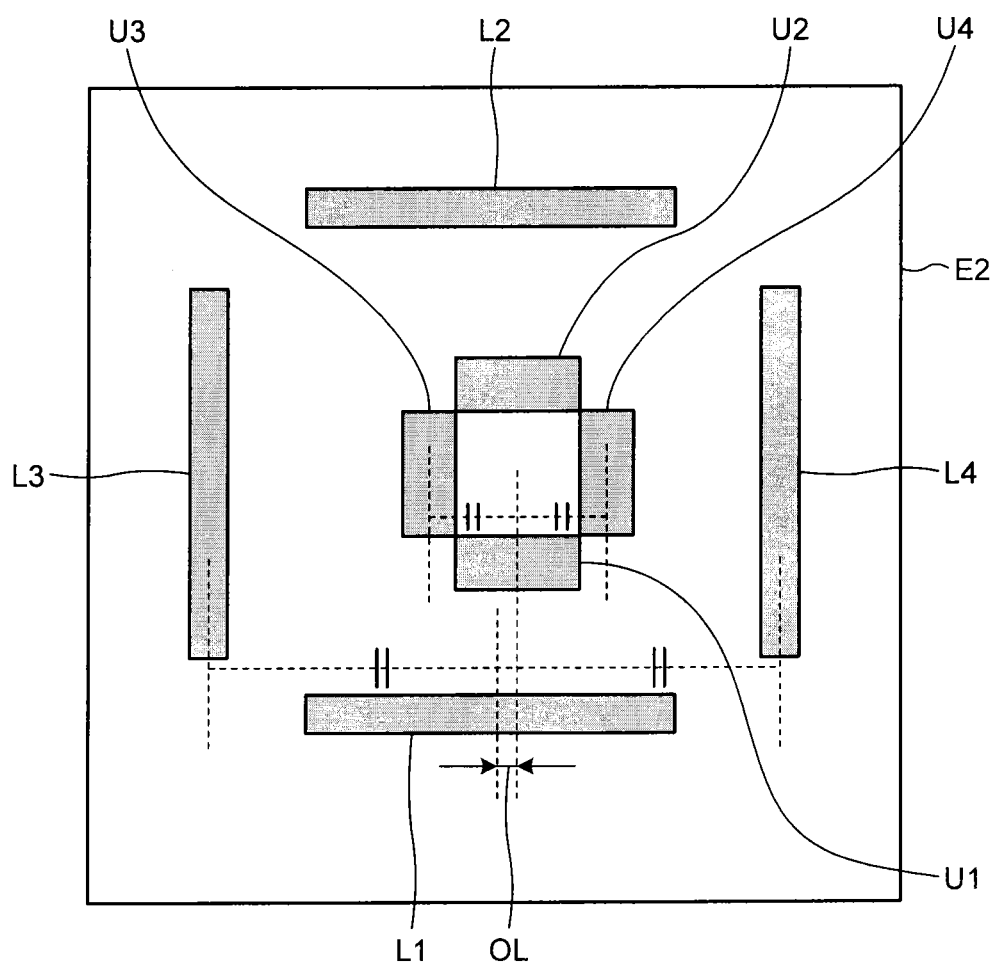
FIG. 3 is a plan view showing an example positional-deviation detecting mark placed in a mark area of FIG. 2.

FIG. 3 is a plan view showing an example positional-deviation detecting mark placed in a mark area of FIG. 2.

In FIG. 3, positional-deviation detecting marks L1 to L4 are formed in the lower layer of the mark area E2, and positional-deviation detecting marks U1 to U4 are formed in the upper layer of the mark area E2. The positional-deviation detecting marks L1 to L4 can be positioned, e.g., on the four sides of a square, and the positional-deviation detecting marks U1 to U4 can be positioned, e.g., on the four sides of a square inside the square on whose sides the positional-deviation detecting marks L1 to L4 are positioned in a similitude relation. At this time, the positional-deviation detecting marks L1, L2, U1, U2 can be positioned along an X axis, and the positional-deviation detecting marks L3, L4, U3, U4 can be positioned along a Y axis. Here, as a method of calculating deviation in alignment OL of the positional-deviation detecting marks L1 to L4 and U1 to U4, there is, e.g., a method which calculates the centroid locations of the positional-deviation detecting marks L1 to L4 and of the positional-deviation detecting marks U1 to U4 to compare these centroid locations. With the positional-deviation detecting mark of FIG. 3, deviation in alignment OL can be calculated for an X axis direction and Y axis direction separately.

Figure 4B:
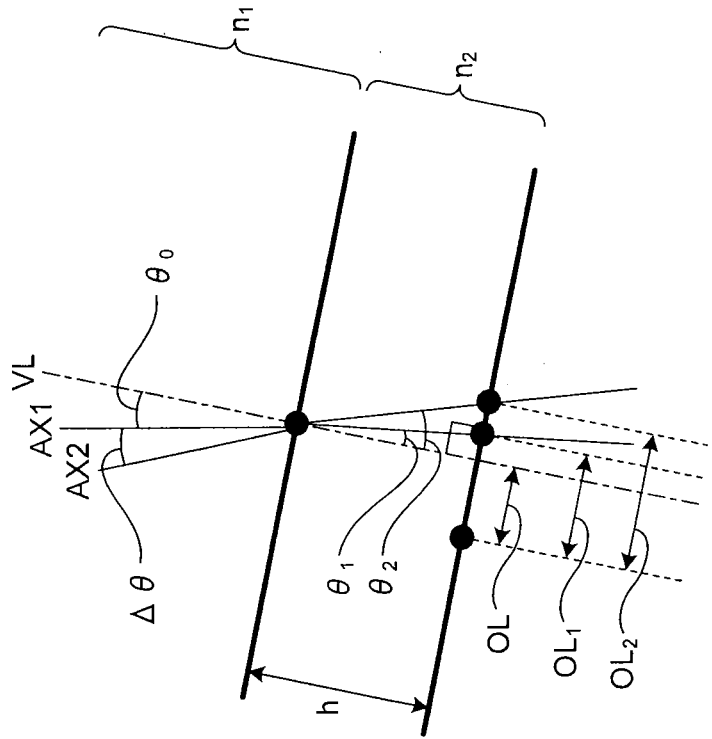
FIG. 4B is a diagram showing the method of calculating deviation in alignment in the positional deviation measuring device of FIG. 1.
Figure 4A:
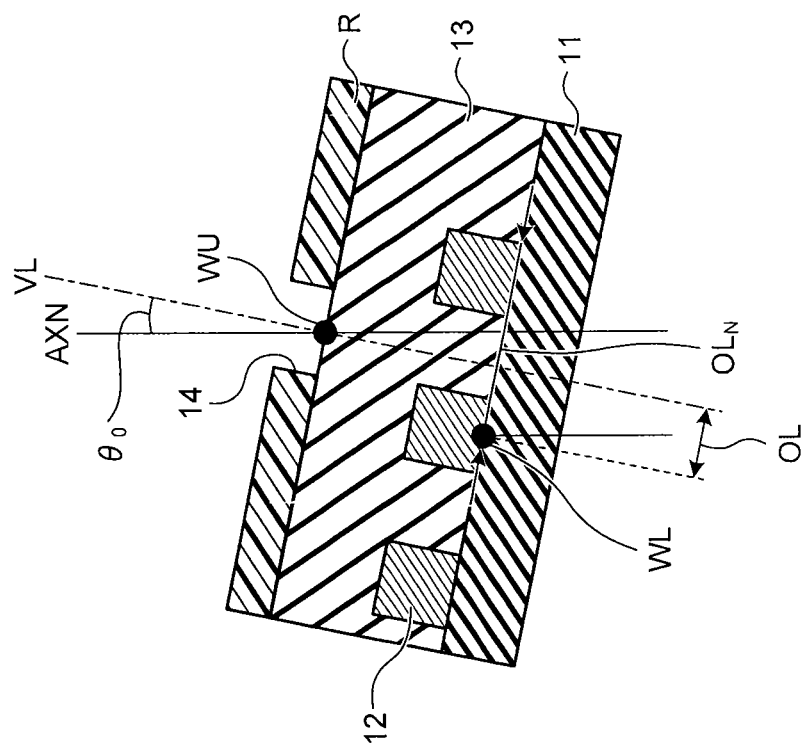
FIG. 4A is a cross-sectional view showing a relation between deviation in alignment and measurements when the wafer is inclined with respect to an optical axis.

FIG. 4A is a cross-sectional view showing a relation between deviation in alignment and measurements when the wafer is inclined with respect to an optical axis, and FIG. 4B is a diagram showing the method of calculating deviation in alignment in the positional deviation measuring device of FIG. 1.

In FIG. 4A, a lower-layer pattern 12 is formed on an underlayer 11. An upper-layer pattern 14 is formed on the lower-layer pattern 12 via an interlayer film 13. In FIG. 4A, an opening pattern made in a resist film R is taken as an example of the upper-layer pattern 14. Note that the underlayer 11 may be a substrate, an insulating layer, or a line layer. Here, deviation in alignment OL of the lower-layer pattern 12 and upper-layer pattern 14 can be given by the distance between the centroid WL of the lower-layer pattern 12 and the centroid WU of the upper-layer pattern 14 when seen in a direction perpendicular to a normal VL to the lower-layer pattern 12. In this situation, if the optical axis AXN of light incident on the upper-layer pattern 14 inclines from the normal VL by an incident angle $\theta_0$ due to a warp of the wafer W or so on, an actual measurement of the deviation in alignment OL is given by OL$_N$, so that an error from the deviation in alignment OL occurs. The deviation in alignment OL can be expressed as a two-variable function of the incident angle $\theta_0$ and actual measurement OL$_N$. By measuring the actual measurement OL$_N$, the deviation in alignment OL and incident angle $\theta_0$ remain unknown. Hence, at least two equations with the deviation in alignment OL and incident angle $\theta_0$ as variables are needed in order to obtain the deviation in alignment OL from the actual measurement OL$_N$. In order to obtain such two equations, the actual measurement OL$_N$ needs to be made to vary. Even if the wafer is warped, only rotating the wafer in a horizontal plane does not cause the actual measurement OL$_N$ to vary.

Accordingly, in order to obtain two equations with different actual measurements OL$_N$, light with an optical axis AX1 and light with an optical axis AX2 are made incident on the upper-layer pattern 14 as shown in FIG. 4B. The optical axis AX1 inclines from the normal VL by an incident angle $\theta_0$, and the optical axis AX2 inclines from the normal VL by an incident angle $\theta_0+\Delta\theta$. In this situation, if the refractive index is different between the medium on the incidence side of the upper-layer pattern 14 and the medium on the other side (after-incident side) of the upper-layer pattern 14, then incident light is refracted at the boundary between these media. Letting $n_1$ be the refractive index of the medium on the incidence side of the upper-layer pattern 14 and $n_2$ be the refractive index of the medium on the after-incident side of the upper-layer pattern 14, the refracting angle $\theta_1$ for the incident angle $\theta_0$ is given by the following equation (1).

$$\theta_1 = \sin^{-1}(n_1/n_2 \cdot \sin \theta_0) \tag{1}$$

The refracting angle $\theta_2$ for the incident angle $\theta_0+\Delta\theta$ is given by the following equation (2).

$$\theta_2 = \sin^{-1}(n_1/n_2 \cdot \sin(\theta_0+\Delta\theta)) \tag{2}$$

For the optical axis AX1, the function of the deviation in alignment OL and incident angle $\theta_0$ that represents an actual measurement OL$_1$ is given by the following equation (3) using the equation (1).

$$OL_1 = OL + h \cdot \tan(\sin^{-1}(n_1/n_2 \cdot \sin \theta_0)) \tag{3}$$

Further, for the optical axis AX2, the function of the deviation in alignment OL and incident angle $\theta_0+\Delta\theta$ that represents an actual measurement OL$_2$ is given by the following equation (4) using the equation (2).

$$OL_2 = OL + h \cdot \tan(\sin^{-1}(n_1/n_2 \cdot \sin(\theta_0+\Delta\theta))) \tag{4}$$

Here, h is the thickness of the interlayer film 13. The displacement angle $\Delta\theta$ is set by the angle adjusting unit 2 of FIG. 1 and known.

With the equations (3) and (4), while OL and $\theta_0$ are unknown, there are two equations, and hence by solving the equations (3) and (4), the deviation in alignment OL can be obtained. At the same time, the incident angle $\theta_0$ can also be obtained. Because this incident angle $\theta_0$ is determined by the warp of the wafer W, by solving the equations (3) and (4), the warp angle of the wafer W can also be obtained. Hence, this positional deviation measuring device may be used as an alignment deviation measuring device or a warp measuring device. The refractive indexes $n_1$, $n_2$ and the film thickness h can be given as known quantities to the calculating unit 6.

By setting two or more displacement angles $\Delta\theta$, three or more equations with the deviation in alignment OL and incident angle $\theta_0$ as variables can be obtained. By obtaining three or more equations, the deviation in alignment OL can be obtained even if the refractive indexes $n_1$, $n_2$ and the film thickness h are unknown. Also where a plurality of solutions are obtained by solving the equations (3) and (4), three or more equations may be formulated. Further, the range of values which the deviation in alignment OL can take on may be specified beforehand so as to leave out solutions outside the range.

Figure 5:
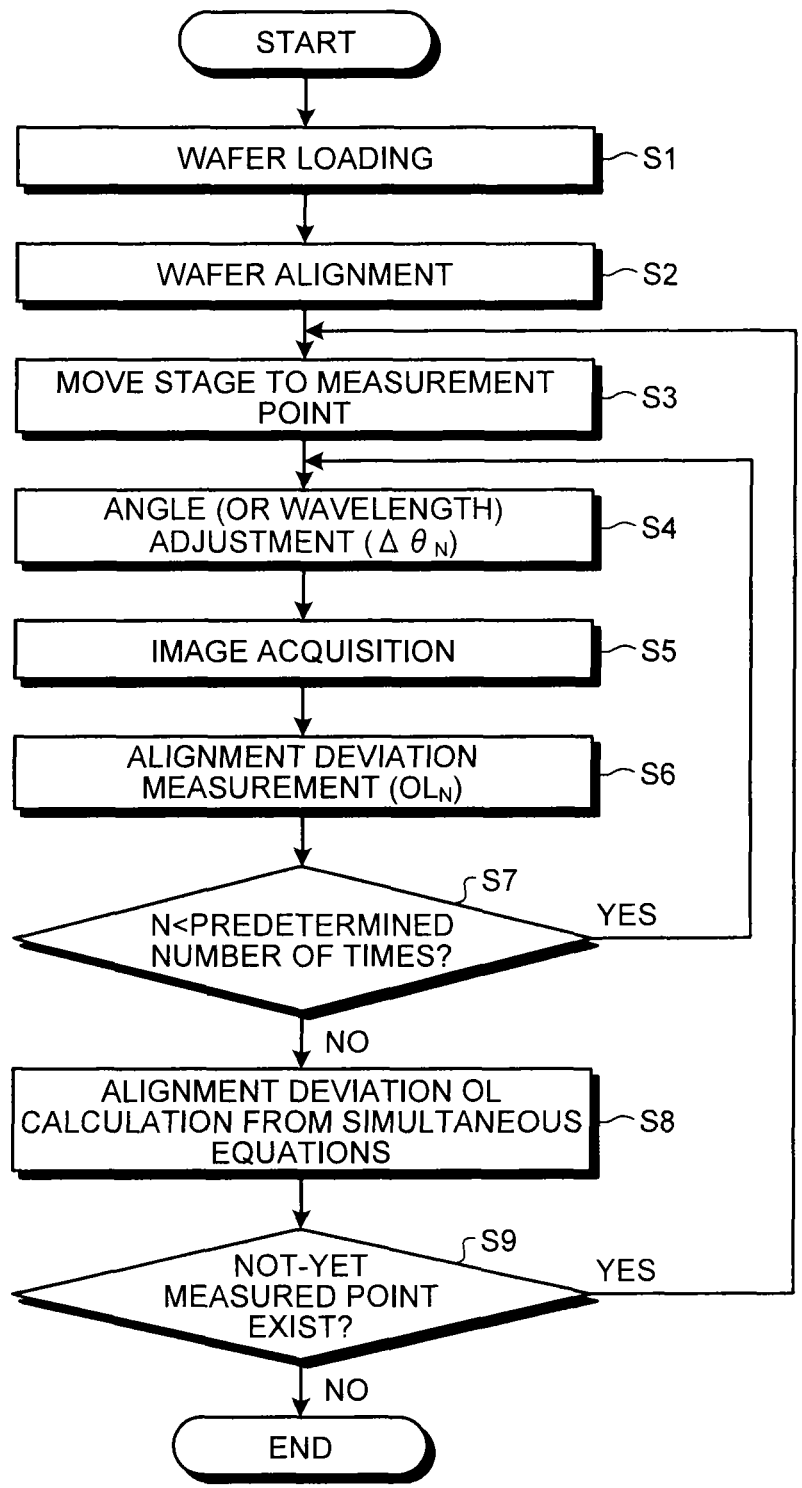
FIG. 5 is a flow chart showing the method of calculating deviation in alignment in the positional deviation measuring device of FIG. 1.

FIG. 5 is a flow chart showing the method of calculating the deviation in alignment in the positional deviation measuring device of FIG. 1. FIG. 5 shows an example where it is generalized to the case where there are N number of displacement angles $\Delta\theta$.

In FIG. 5, a wafer W is loaded onto a wafer stage 1 (S1). Then after the wafer W is aligned so that the mark areas E2 can be observed (S2), the wafer stage 1 is moved to a measurement point (S3). Then by changing the displacement angle $\Delta\theta$ to become $\Delta\theta_N$, the incident angle is changed, so that light is made incident on the wafer W with that incident angle (S4). It is preferable to set displacement angles $\Delta\theta$ to be greater than errors of the measuring instrument, and, for example, they can be set to be in the range from 1 to 100 micro-radians. Then the detector 5 receives reflected light from the wafer W to produce an image of a mark area E2 to send to the calculating unit 6 (S5). Next, the calculating unit 6 calculates an actual measurement $OL_N$ of the deviation in alignment from an image produced when the displacement angle $\Delta\theta$ is $\Delta\theta_N$ (S6). Then it is determined whether the number N of change times of the displacement angle $\Delta\theta$ is smaller than a predetermined number of times (S7), and if the number N of change times is smaller than the predetermined number of times, the process returns to S4, and the process of S4 to S7 is repeated until the number N of change times becomes greater than or equal to the predetermined number of times. By repeating this process N number of times, N number of simultaneous equations with the deviation in alignment OL as an unknown can be obtained. These N number of simultaneous equations can be given by the following equation (5). An example where, with the initial value of N being 1, N is incremented by one each time the displacement angle $\Delta\theta$ is changed is shown in the equation (5).

$$OL_1 = OL + h \cdot \tan(\sin^{-1}(n_1/n_2 \cdot \sin(\theta_0 + \Delta\theta_1)))$$
$$OL_2 = OL + h \cdot \tan(\sin^{-1}(n_1/n_2 \cdot \sin(\theta_0 + \Delta\theta_2)))$$
$$\ldots$$
$$OL_N = OL + h \cdot \tan(\sin^{-1}(n_1/n_2 \cdot \sin(\theta_0 + \Delta\theta_N)))$$

(5)

Note that any one of $\Delta\theta_1$ to $\Delta\theta_N$ in the equation (5) may be zero. The equation (3) is a case where $\Delta\theta_N$ is zero.

Then if the number N of change times is greater than or equal to the predetermined number of times, by solving these N number of simultaneous equations, the deviation in alignment OL is obtained (S8). Next, it is determined whether a not-yet measured point exists (S9), and if a not-yet measured point exists, the process returns to S3, and the process of S3 to S9 is repeated until there is no not-yet measured point.

Thus, where actual measurements $OL_1, OL_2, \ldots, OL_N$ are different from the deviation in alignment OL due to a warp of the wafer W, an error in the deviation in alignment OL of the upper-layer pattern and lower-layer pattern can be reduced.

The rotation axis of the wafer stage 1 used when the displacement angle $\Delta\theta$ is varied is preferably an axis inclining by 45 degrees from the X axis in the XY plane of FIG. 3. By this means, a decrease in measurement accuracy depending on the direction of a warp of the wafer W can be prevented. Further, although in the above embodiment the method which inclines the wafer stage 1 in order to vary the incident angle has been described, the light source 3 may be inclined. Or a mirror to vary the incident angle may be provided in the optical path of the incident light.

Second Embodiment

Figure 6:
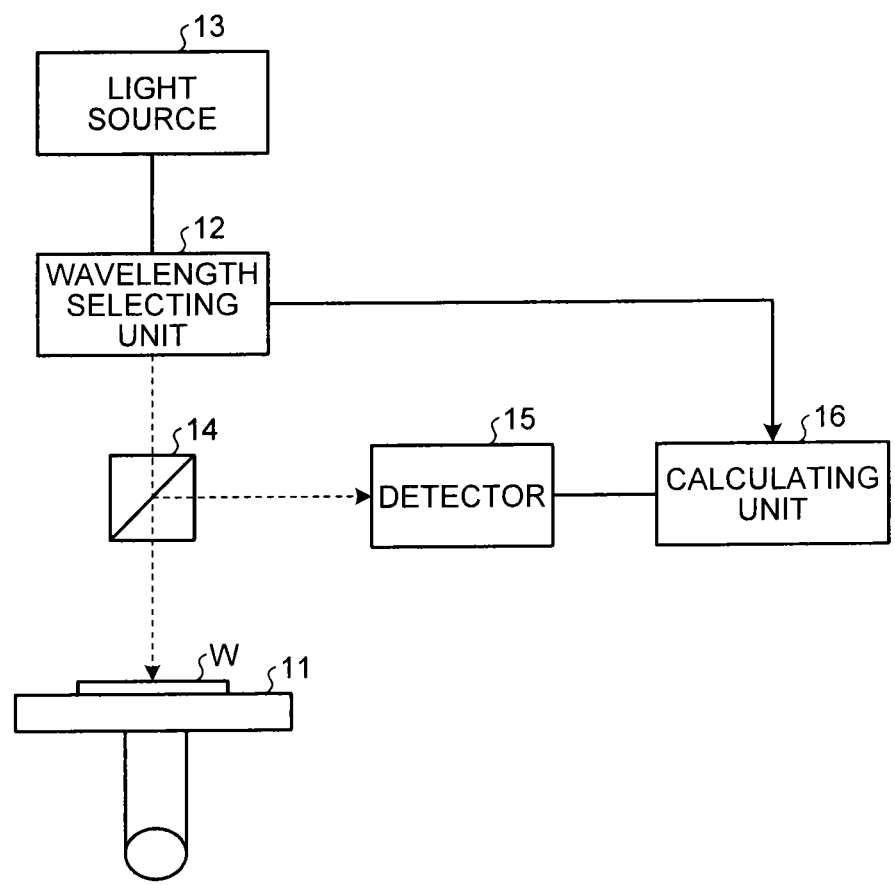
FIG. 6 is a block diagram showing schematically the configuration of a positional deviation measuring device according to a second embodiment.

FIG. 6 is a block diagram showing schematically the configuration of a positional deviation measuring device according to the second embodiment. In FIG. 6, a wafer stage 11, a wavelength selecting unit 12, a light source 13, a half mirror 14, a detector 15, and a calculating unit 16 are provided in the positional deviation measuring device. The wafer stage 11 holds a wafer W. The wavelength selecting unit 12 selects a specific wavelength from the incident light emitted by the light source 13. For example, a wavelength selecting filter can be used as the wavelength selecting unit 12. The light source 13 generates light to be incident on the wafer W. The incident light can have a plurality of wavelength regions and may be, for example, visible light of from the red region to the blue region. The half mirror 14 separates light to be incident on the wafer W and reflected light from the wafer W. The detector 15 detects reflected light from the wafer W. The calculating unit 16 calculates deviation in pattern alignment based on patterns respectively reflected in reflected lights obtained from light having N number of wavelengths incident onto the wafer W (N is an integer of two or greater).

The incident light emitted by the light source 13 has a specific wavelength selected by the wavelength selecting unit 12 and then is incident on the wafer W via the half mirror 14. The light reflected from the wafer W is incident on the detector 15 via the half mirror 14 and detected by the detector 15. Then the calculating unit 16 extracts a pattern from an image reflected in the reflected light. Here, the wavelength selecting unit 12 selects a different wavelength from the incident light to change the wavelength of light to be incident on the wafer W each time the calculating unit 16 extracts a pattern. Then, each time the wavelength of light incident on the wafer W is changed, the calculating unit 16 extracts a pattern from an image reflected in the reflected light at this time. The deviation in the pattern alignment is calculated based on patterns respectively reflected in reflected lights obtained from incident light having N number of wavelengths.

Although in the above embodiment the method which selects one wavelength region from a plurality of wavelength regions included in the light source 13 in order to change the wavelength of the incident light has been described, the wavelength of light to be incident may be made to vary when generated by the light source 13. In this case, for example, a red diode and a blue diode may be provided as the light source 13 to switch light to be incident between red light and blue light.

Figure 7:
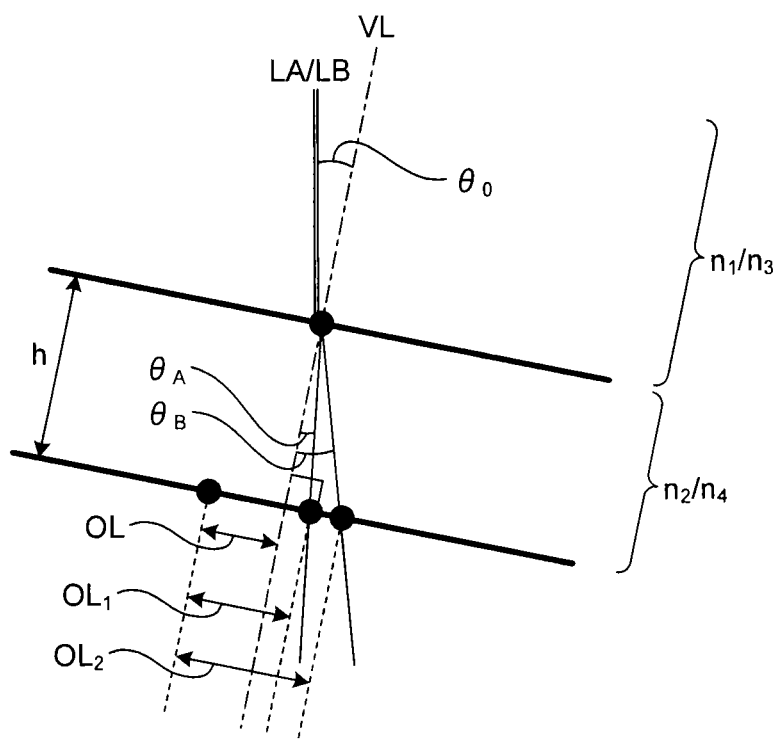
FIG. 7 is a diagram showing the method of calculating deviation in alignment in the positional deviation measuring device of FIG. 6.

FIG. 7 is a diagram showing the method of calculating deviation in alignment in the positional deviation measuring device of FIG. 6.

Although in FIG. 4B the method which makes the incident angle different to obtain different refracting angles has been described, different refracting angles can be obtained by making the wavelength of the incident light different.

That is, in FIG. 7, incident light LA having a wavelength $\lambda_A$ and incident light LB having a wavelength $\lambda_B$ are made incident on the upper-layer pattern 14. The incident lights LA, LB incline from the normal VL by an incident angle $\theta_0$. If the wavelengths of the incident lights LA, LB are different, the refracting angles are different even with the same incident angle $\theta_0$. In this case, the refracting angle $\theta_A$ of the incident light LA is given by the following equation (6).

$$\theta_A = \sin^{-1}(n_1/n_2 \cdot \sin \theta_0) \quad (6)$$

The refracting angle $\theta_B$ of the incident light LB is given by the following equation (7).

$$\theta_B = \sin^{-1}(n_3/n_4 \cdot \sin \theta_0) \quad (7)$$

For the incident light LA, the function of the deviation in alignment OL and incident angle $\theta_0$ that represents an actual measurement $OL_1$ is given by the following equation (8) using the equation (6).

$$OL_1 = OL + h \cdot \tan(\sin^{-1}(n_1/n_2 \cdot \sin \theta_0)) \quad (8)$$

Further, for the incident light LB, the function of the deviation in alignment OL and incident angle $\theta_0$ that represents an actual measurement $OL_2$ is given by the following equation (9) using the equation (7).

$$OL_2 = OL + h \cdot \tan(\sin^{-1}(n_3/n_4 \cdot \sin \theta_0)) \quad (9)$$

With the equations (8) and (9), while OL and $\theta_0$ are unknown, there are two equations, and hence by solving the equations (8) and (9), the deviation in alignment OL can be obtained. At the same time, the incident angle $\theta_0$ can also be obtained. Because this incident angle $\theta_0$ is determined by the warp of the wafer W, by solving the equations (8) and (9), the warp angle of the wafer W can also be obtained. The refractive indexes $n_1$, $n_2$, $n_3$, $n_4$ and the film thickness h can be given as known quantities to the calculating unit 16.

By setting three or more wavelengths, three or more equations with the deviation in alignment OL and incident angle $\theta_0$ as variables can be obtained. By obtaining three or more equations, the deviation in alignment OL can be obtained even if the refractive indexes $n_1$, $n_2$, $n_3$, $n_4$ and the film thickness h are unknown. Also where a plurality of solutions are obtained by solving the equations (8) and (9), three or more equations may be formulated. Further, the range of values which the deviation in alignment OL can take on may be specified beforehand so as to leave out solutions outside the range.

Third Embodiment

Figure 8:
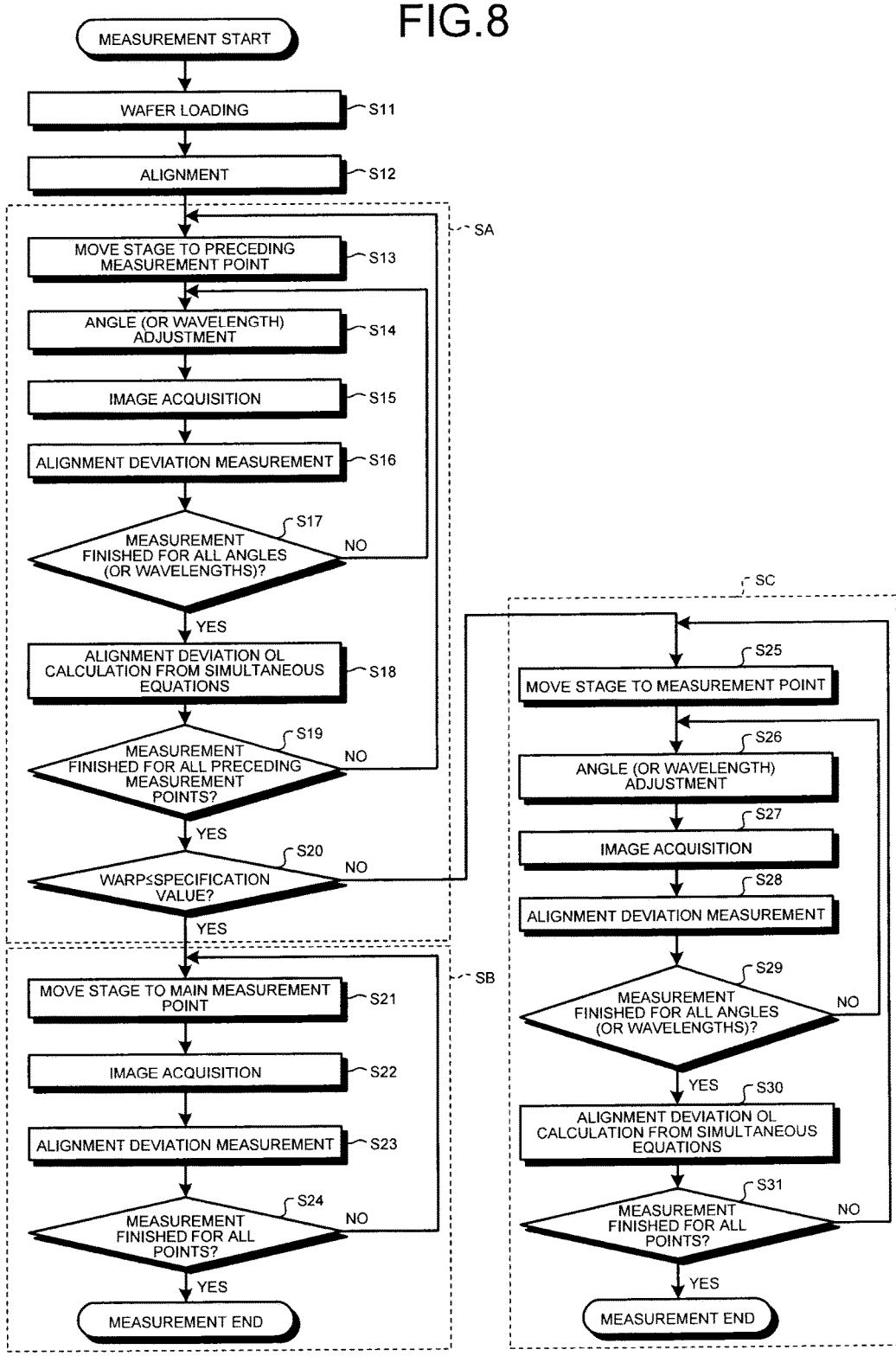
FIG. 8 is a flow chart showing a positional deviation measuring method according to a third embodiment.

FIG. 8 is a flow chart showing a positional deviation measuring method according to the third embodiment. This embodiment is configured as follows. A warp of the wafer is obtained by varying the incident angle or wavelength of the incident light before the deviation in alignment is obtained by varying the incident angle or wavelength of the incident light. Then if the warp of the wafer exceeds a specification value, the deviation in alignment is obtained by varying the incident angle or wavelength of the incident light.

In FIG. 8, this process has mainly three blocks SA, SB, SC. In the block SA, a warp of the wafer is determined. In the block SB, the deviation in alignment is obtained with the incident angle and wavelength of the incident light being fixed. In the block SC, the deviation in alignment is obtained by varying the incident angle or wavelength of the incident light.

That is, a wafer W is loaded onto a wafer stage 1 (S11). Then after the wafer W is aligned so that the mark areas E2 can be observed (S12), the wafer stage is moved to a preceding measurement point (S13). The preceding measurement point is a mark area E2 used to obtain a warp of the wafer. As this mark area E2, a mark area E2 on the periphery can be used from among the mark areas E2 of FIG. 2. At a mark area E2 on the periphery, the incident angle $\theta_0$ is greater due to a warp of the wafer W, and hence accuracy in calculating the warp of the wafer W can be improved. Then the incident light is made incident on the wafer W with changing the incident angle or wavelength of the incident light (S14). Then reflected light from the wafer W is detected, thereby producing an image of the mark area E2 (S15). Next, an actual measurement of the deviation in alignment is calculated from an image obtained when the incident angle or wavelength of the incident light is changed (S16). Then it is determined whether measurement has been performed for all the incident angles or wavelengths (S17), and if measurement has not been performed for all the incident angles or wavelengths, the process returns to S14, and the process of S14 to S17 is repeated until measurement has been performed for all the incident angles or wavelengths. Then if measurement has been performed for all the incident angles or wavelengths, by solving simultaneous equations in terms of these actual measurements of the deviation in alignment, the incident angle $\theta_0$ is obtained and taken as the warp of the wafer W (S18). Next, it is determined whether measurement has been performed for all preceding measurement points (S19), and if measurement has not been performed for all preceding measurement points, the process returns to S13, and the process of S13 to S19 is repeated until measurement has been performed for all preceding measurement points. Then if measurement has been performed for all preceding measurement points, it is determined whether the warp of the wafer W is smaller than or equal to a specification value (S20). If the warp of the wafer W is smaller than or equal to the specification value, the wafer stage is moved to a main measurement point (S21). The main measurement point is a mark area E2 used to obtain the deviation in alignment. As this mark area E2, a mark area E2 near the center is preferably used from among the mark areas E2 of FIG. 2. Because the warp of the wafer W is smaller at the center of the wafer W, with a mark area E2 near the center of the wafer W, an error in the deviation in alignment due to the warp of the wafer W can be reduced. Then the incident light is made incident on the wafer W, and reflected light from the wafer W is detected, thereby producing an image of the mark area E2 (S22). Then the deviation in alignment is calculated from the image obtained at this time (S23). Then it is determined whether measurement has been performed for all main measurement points (S24), and if measurement has not been performed for all main measurement points, the process returns to S21, and the process of S21 to S24 is repeated until measurement has been performed for all main measurement points.

On the other hand, if the warp of the wafer W exceeds the specification value, the wafer stage is moved to a measurement point (S25). Then the incident angle or wavelength of the incident light is changed, and the incident light is made incident on the wafer W (S26). Then reflected light from the wafer W is detected, thereby producing an image of the mark area E2 (S27). Then an actual measurement of the deviation in alignment is calculated from the image obtained when the incident angle or wavelength of the incident light has been changed (S28). Then it is determined whether measurement has been performed for all the incident angles or wavelengths (S29), and if measurement has not been performed for all the incident angles or wavelengths, the process returns to S26, and the process of S26 to S29 is repeated until measurement has been performed for all the incident angles or wavelengths. Then if measurement has been performed for all the incident angles or wavelengths, by solving simultaneous equations in terms of these actual measurements of the deviation in alignment, the deviation in alignment OL is obtained (S30). Then it is determined whether measurement has been performed for all measurement points (S31), and if measurement has not been performed for all measurement points, the process returns to S25, and the process of S25 to S31 is repeated until measurement has been performed for all measurement points.

Thus, without a dedicated device to detect a warp of a wafer W being added, a warp of the wafer W can be determined, and where actual measurements $OL_1$, $OL_2$, . . . , $OL_N$ are different from the deviation in alignment OL due to a warp of the wafer W, an error in the deviation in alignment OL of the upper-layer pattern and lower-layer pattern can be reduced.

Fourth Embodiment

Figure 9:
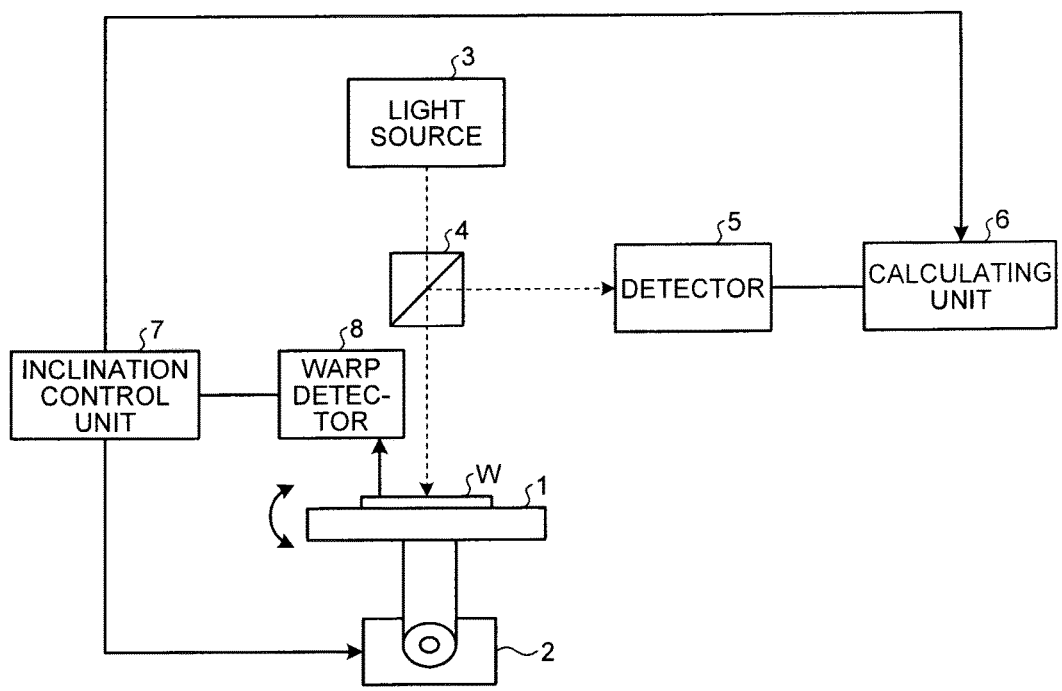
FIG. 9 is a block diagram showing schematically the configuration of a positional deviation measuring device according to a fourth embodiment.
Figure 10:
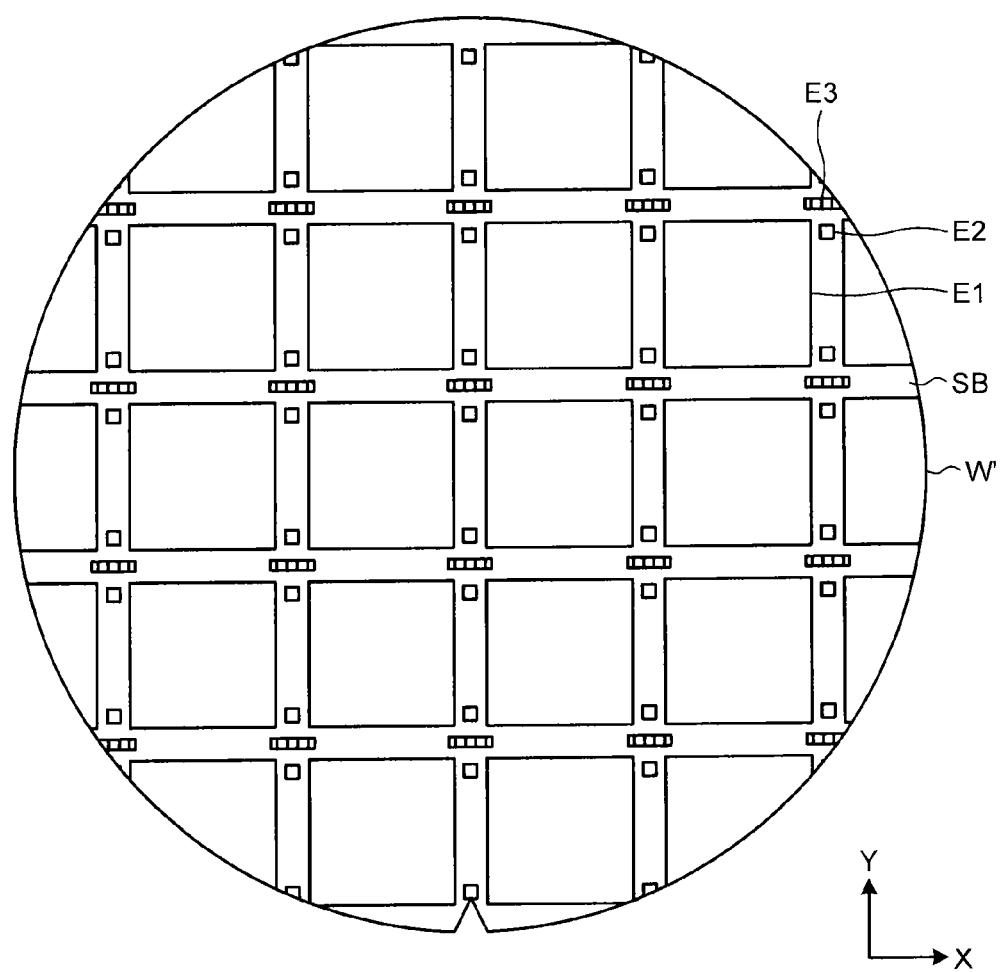
FIG. 10 is a plan view showing schematically an example configuration of a wafer to which the positional deviation measuring device of FIG. 9 is applied.

FIG. 9 is a block diagram showing schematically the configuration of a positional deviation measuring device according to the fourth embodiment, and FIG. 10 is a plan view showing schematically an example configuration of a wafer to which the positional deviation measuring device of FIG. 9 is applied.

In FIG. 9, this positional deviation measuring device is constituted by a warp detector 8 added to the positional deviation measuring device of FIG. 1. In FIG. 10, this wafer W' is constituted by warp detecting marks E3 added to the wafer W of FIG. 2. A diffraction pattern can be used as the warp detecting mark E3.

Before the deviation in alignment is calculated, a warp detecting mark E3 is detected by the warp detector 8, and a warp of the wafer W' is calculated from the detecting result. At this time, because the focus position for the warp detecting mark E3 changes according to the warp of the wafer W', the warp of the wafer W' can be obtained from the amount of the change. Then if the warp of the wafer W' exceeds a specification value, the deviation in alignment is obtained by varying the incident angle or wavelength of the incident light. On the other hand, if the warp of the wafer W' is smaller than or equal to the specification value, the deviation in alignment is obtained with the incident angle and wavelength of the incident light being fixed.

Although in the above embodiment the configuration where the warp detector 8 is added to the positional deviation measuring device of FIG. 1 has been described, the warp detector 8 may be added to the positional deviation measuring device of FIG. 6.

Figure 11:
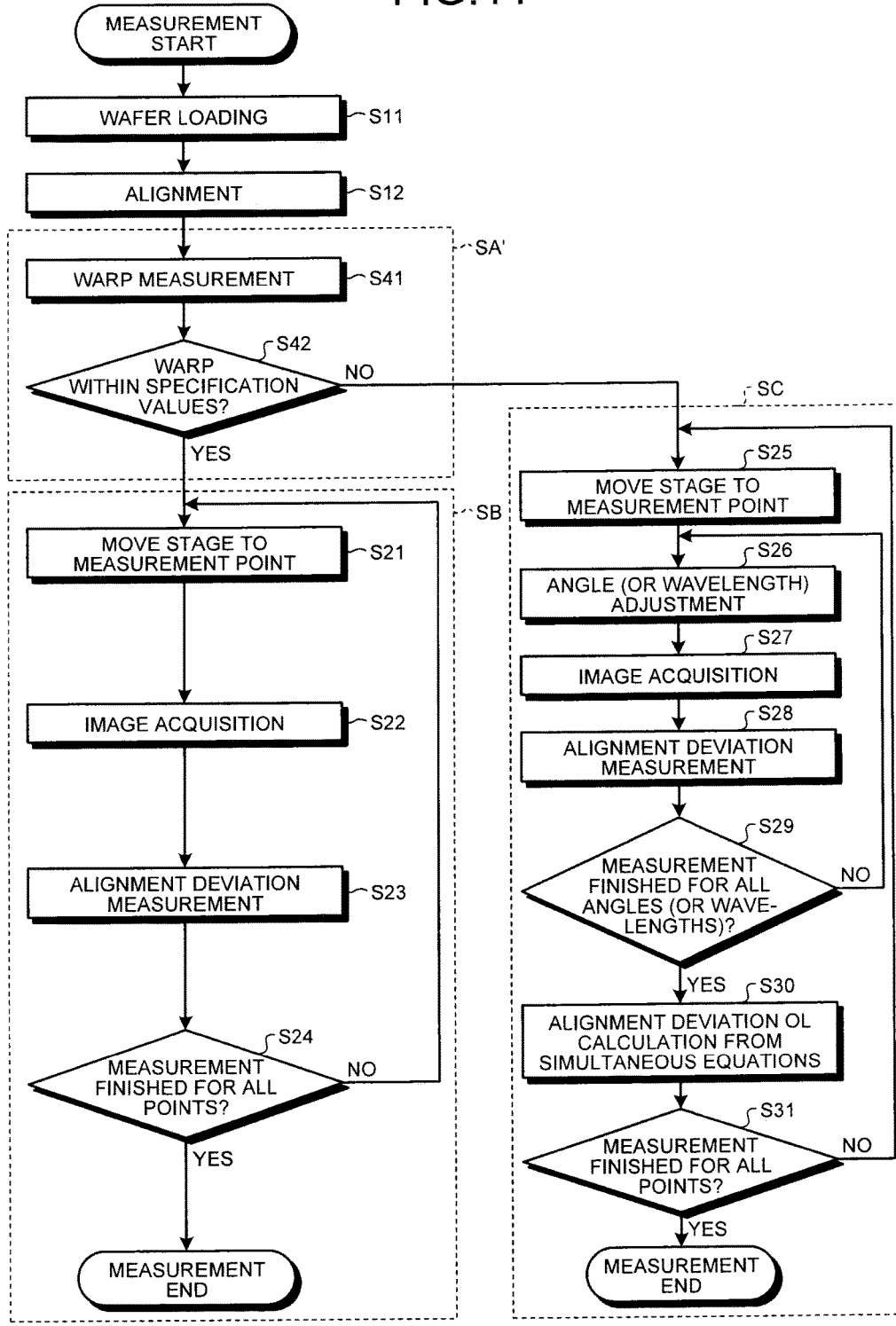
FIG. 11 is a flow chart showing the method of calculating deviation in alignment in the positional deviation measuring device of FIG. 9.

FIG. 11 is a flow chart showing the method of calculating deviation in alignment in the positional deviation measuring device of FIG. 9.

In FIG. 11, in this process a block SA' is provided instead of the block SA of FIG. 8. In the block SA', a warp of the wafer W' is measured by the warp detector 8 of FIG. 9 (S41). Then it is determined whether the warp of the wafer W' is smaller than or equal to the specification value based on the measuring result of the warp detector 8 (S42). If the warp of the wafer W' is smaller than or equal to the specification value, the block SB is executed. On the other hand, if the warp of the wafer W' exceeds the specification value, the block SC is executed. Thus, where there is no warp of the wafer W', the block SC can be prevented from being executed, so that an increase in the time for measuring the deviation in alignment OL can be suppressed.

Fifth Embodiment

FIGS. 12A to 12H and FIGS. 13A to 13H are cross-sectional views showing a method of manufacturing a semiconductor device according to the fifth embodiment. Note that FIGS. 12A to 12D and FIGS. 13A to 13D correspond to a mark area E2 of FIG. 2, and FIGS. 12E to 12H and FIGS. 13E to 13H correspond to a chip area E1 of FIG. 2.

Figure 12A:
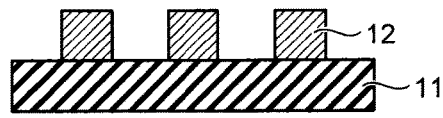
FIGS. 12A to 12H are cross-sectional views showing a method of manufacturing a semiconductor device according to a fifth embodiment.
Figure 12E:
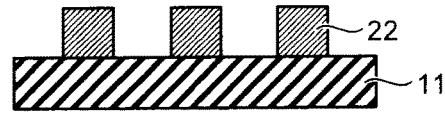

In FIGS. 12A and 12E, the lower-layer pattern 12 is formed on the mark area E2 of the underlayer 11, and simultaneously a lower-layer pattern 22 is formed on the chip area E1 of the underlayer 11. The lower-layer pattern 22 may be active regions such as a source layer or a drain layer, or lower-layer lines.

Figure 12B:
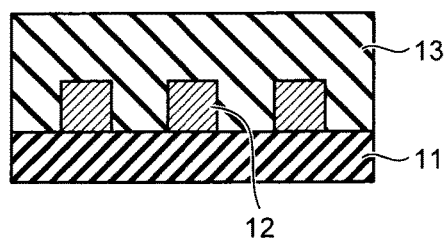
Figure 12F:
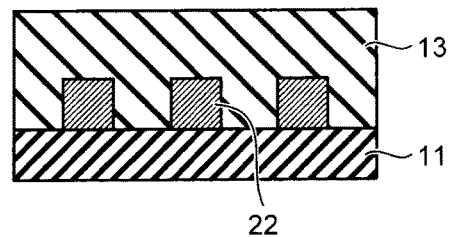

Then, as shown in FIGS. 12B and 12F, the interlayer film 13 is formed on the lower-layer patterns 12, 22 by a method such as CVD. For example, an interlayer insulating film such as $SiO_2$ can be used as the interlayer film 13.

Figure 12C:
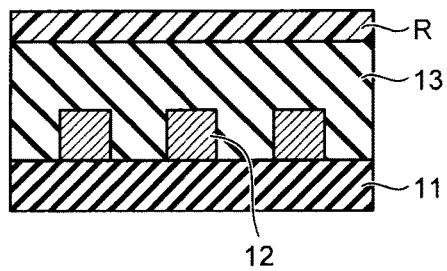
Figure 12G:
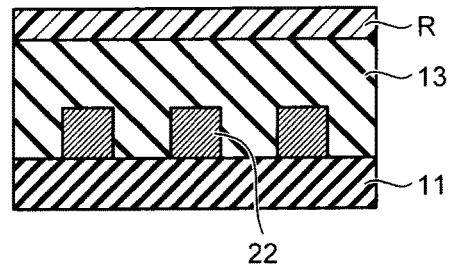

Then, as shown in FIGS. 12C and 12G, a resist film R is formed on the interlayer film 13 by a method such as spin coating.

Figure 12D:
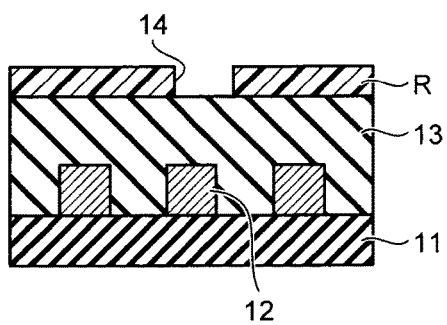
Figure 12H:
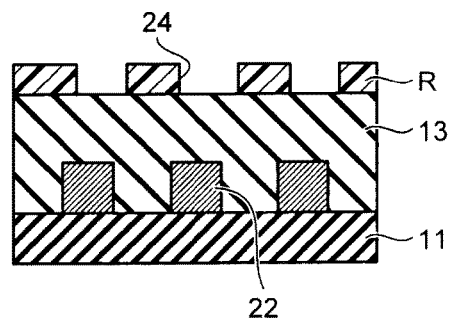

Then, as shown in FIGS. 12D and 12H, the resist film R is patterned by photolithography to form upper-layer patterns 14, 24 on the interlayer film 13.

Next, as shown in FIGS. 13A and 13E, the deviation in alignment OL of the lower-layer pattern 12 and the upper-layer pattern 14 is obtained by a positional deviation inspecting device. This positional deviation inspecting device may have the configuration of FIG. 1, FIG. 6, or FIG. 9.

Then, as shown in FIGS. 13B and 13F, if the deviation in alignment OL of the lower-layer pattern 12 and the upper-layer pattern 14 is not within specification values, the resist film R is removed. Then, a resist film R' is formed on the interlayer film 13 by a method such as spin coating. Further, the resist film R' is patterned by photolithography to form upper-layer patterns 14', 24' on the interlayer film 13. Then the deviation in alignment OL' of the lower-layer pattern 12' and the upper-layer pattern 14' is obtained by the positional deviation inspecting device.

Then, as shown in FIGS. 13C and 13G, if the deviation in alignment OL' of the lower-layer pattern 12' and the upper-layer pattern 14' is within the specification values, the interlayer film 13 is etched through the upper-layer patterns 14', 24', thereby forming openings 15, 25 corresponding to the upper-layer patterns 14', 24' in the interlayer film 13.

Then, as shown in FIGS. 13D and 13H, contact plugs 16, 26 are filled into the openings 15, 25. Then, upper-layer lines 17, 27 connected to the lower-layer patterns 12, 22 via the contact plugs 16, 26 are formed.

Figure 14:
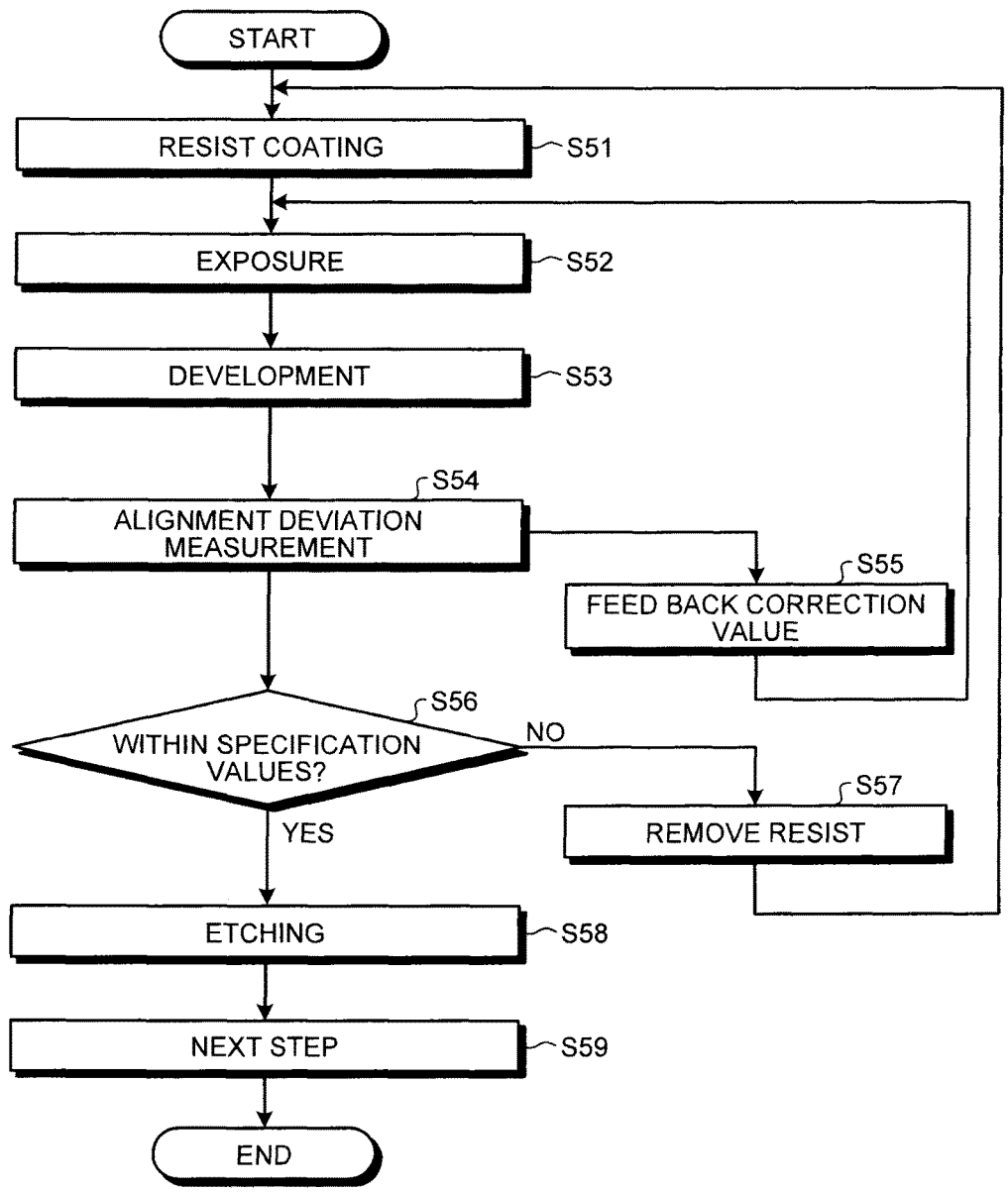
FIG. 14 is a flow chart showing the method of manufacturing the semiconductor device according to the fifth embodiment.

FIG. 14 is a flow chart showing the method of manufacturing the semiconductor device according to the fifth embodiment.

In FIG. 14, a photoresist film is coated over the wafer on which the lower-layer patterns are formed (S51). At this time, a to-be-processed film can be formed between the lower-layer patterns and the photoresist film. Then a reticle and the wafer are loaded into an exposure apparatus, and exposure light is irradiated onto the photoresist film over the wafer, thereby exposing the photoresist film over the wafer (S52). Then the photoresist film is developed to form a resist pattern as an upper-layer pattern over the wafer (S53). Then the wafer over which the resist pattern is formed is loaded into the positional deviation inspecting device. This positional deviation inspecting device may have the configuration of FIG. 1, FIG. 6, or FIG. 9. Then the deviation in alignment OL is obtained by the positional deviation inspecting device (S54). Next, a correction value is calculated based on the deviation in alignment OL to make the deviation in alignment OL close to zero and fed back to the exposure apparatus (S55). Then it is determined whether the deviation in alignment OL is within the specification values (S56), and if not within the specification values, after the resist pattern is removed (S57), the process returns to S51. Then the process of S51 to S57 is repeated until the deviation in alignment OL falls within the specification values. If the deviation in alignment OL falls within the specification values, the to-be-processed film is etched through the resist pattern (S58), and the process proceeds to the next step (S59).

Sixth Embodiment

Figure 15:
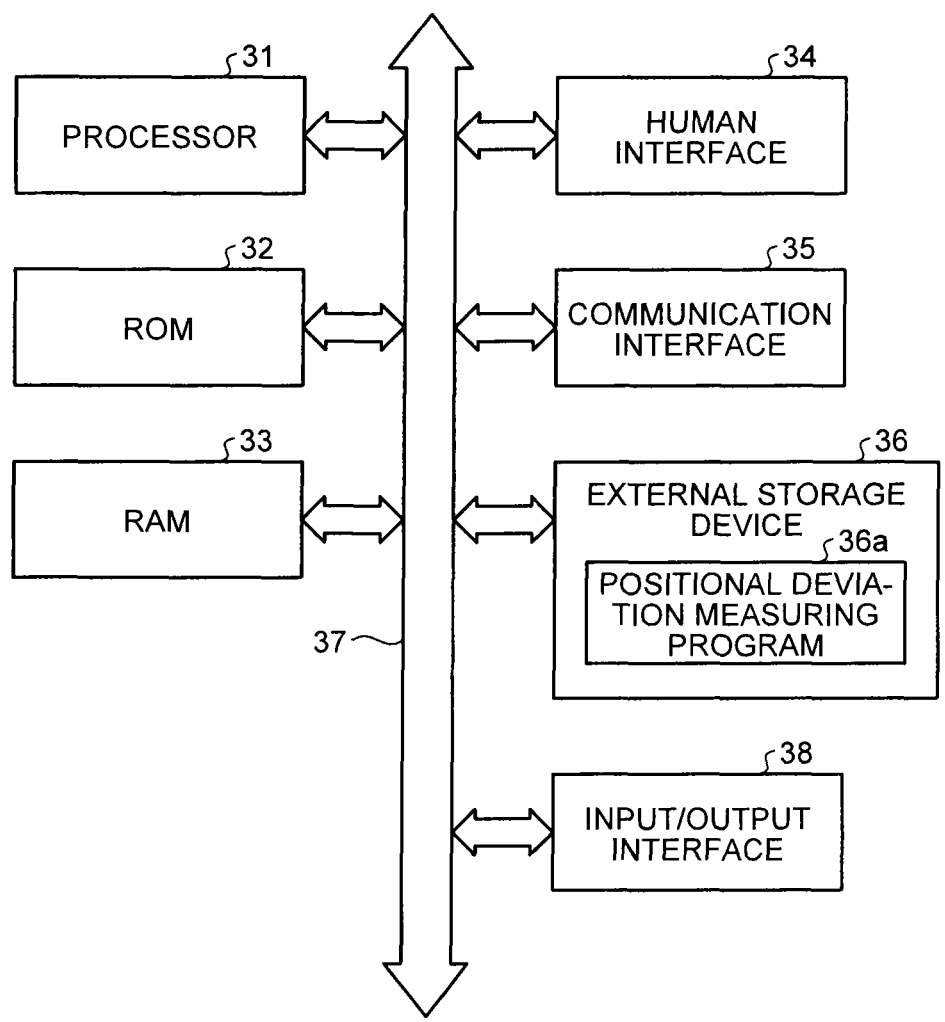
FIG. 15 is a block diagram showing the hardware configuration of a positional deviation measuring device according to a sixth embodiment.

FIG. 15 is a block diagram showing the hardware configuration of a positional deviation measuring device according to the sixth embodiment.

In FIG. 15, in the positional deviation measuring device, there can be provided a processor 31 including a CPU and the like, a ROM 32 storing fixed data, a RAM 33 providing a work area and the like for the processor 31, a human interface 34 mediating between a human and the computer, a communication interface 35 providing a means of communicating with the outside, an external storage device 36 storing programs to cause the processor 31 to operate and various data, and an input/output interface 38 to input/output data from/to the outside, and the processor 31, ROM 32, RAM 33, human interface 34, communication interface 35, external storage device 36, and input/output interface 38 are connected via a bus 37.

As the external storage device 36, for example, a magnetic disk such as a hard disk, an optical disk such as a DVD, a portable semiconductor storage device such as a USB memory or a memory card, or so on can be used. As the human interface 34, for example, a key board, mouse, or touch panel as the input interface 38, or a display or printer as the output interface, or so on can be used. As the communication interface 35, for example, a LAN card, modem, router, or so on to connect to the Internet, a LAN, or so on can be used. Where data inputted to the input interface 38 is analog data, an AD converter to convert the analog data into digital data may be provided. In the external storage device 36, there is installed a positional deviation measuring program 36a that calculates positional deviation based on patterns respectively reflected in reflected lights obtained from incident light inducing N number of refracting angles with respect to a substrate. This positional deviation may be deviation in alignment of an upper-layer pattern and lower-layer pattern formed over the substrate, or a warp of the substrate.

When the positional deviation measuring program 36a is executed by the processor 31, images respectively reflected in reflected lights obtained from incident light generating N number of refracting angles with respect to the substrate are acquired. Then, positional deviation is calculated based on patterns obtained from those images. At this time, the processor 31 can solve the equations of the equation (5).

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A positional deviation measuring device comprising:
   an adjusting unit configured to adjust a refracting angle of incident light with respect to a substrate;
   a detector configured to detect reflected lights from the substrate; and
   a calculating unit configured to calculate positional deviation of a pattern based on patterns respectively reflected in the reflected lights obtained from incident light generating N number of refracting angles with respect to the substrate, where N is an integer of two or greater.

2. The positional deviation measuring device of claim 1, wherein the adjusting unit is an inclination adjusting unit that inclines an optical axis with respect to the substrate.

3. The positional deviation measuring device of claim 1, wherein the adjusting unit is a wavelength adjusting unit that adjusts the wavelength of the incident light.

4. The positional deviation measuring device of claim 1, wherein when N number of actual measurements of positional deviation of the pattern corresponding to the N number of refracting angles are given, the calculating unit solves N number of simultaneous equations that hold for the N number of refracting angles and the N number of actual measurements of positional deviation, thereby calculating the positional deviation of the pattern.

5. The positional deviation measuring device of claim 4, wherein the positional deviation is deviation in alignment of an upper-layer pattern and lower-layer pattern formed over the substrate, or a warp of the substrate.

6. The positional deviation measuring device of claim 5, wherein letting $\Delta\theta_1, \Delta\theta_2, \ldots, \Delta\theta_N$ be displacement angles of an incident angle that induce the refracting angles, OL be the deviation in alignment, $OL_1, OL_2, \ldots, OL_N$ be actual measurements of the positional deviation, $\theta_0$ be a warp of the substrate, h be the distance between the upper-layer pattern and the lower-layer pattern, $n_1$ be the refractive index of a medium on the upper-layer pattern, and $n_2$ be the refractive index of a medium between the upper-layer pattern and the lower-layer pattern, the N number of simultaneous equations are given by:

$$OL_1 = OL + h \cdot \tan(\sin^{-1}(n_1/n_2 \cdot \sin(\theta_0 + \Delta\theta_1)))$$

$$OL_2 = OL + h \cdot \tan(\sin^{-1}(n_1/n_2 \cdot \sin(\theta_0 + \Delta\theta_2)))$$

$$\ldots$$

$$OL_N = OL + h \cdot \tan(\sin^{-1}(n_1/n_2 \cdot \sin(\theta_0 + \Delta\theta_N))).$$

* * * * *